United States Patent
Debroy et al.

(10) Patent No.: US 12,206,412 B2
(45) Date of Patent: Jan. 21, 2025

(54) CHARACTERIZATION OF QUANTUM LOGIC CIRCUITS

(71) Applicant: Google LLC, Mountain View, CA (US)

(72) Inventors: Dripto Mazumdar Debroy, Los Angeles, CA (US); Jonathan Arthur Gross, Venice, CA (US); Zhang Jiang, El Segundo, CA (US); Wojtek Jerzy Mruczkiewicz, Zürich (CH)

(73) Assignee: GOOGLE LLC, Mountain View, CA (US)

( * ) Notice: Subject to any disclaimer, the term of this patent is extended or adjusted under 35 U.S.C. 154(b) by 40 days.

(21) Appl. No.: 18/320,532

(22) Filed: May 19, 2023

(65) Prior Publication Data

US 2024/0388297 A1    Nov. 21, 2024

(51) Int. Cl.
*H03K 19/195* (2006.01)
*G06N 10/40* (2022.01)

(52) U.S. Cl.
CPC ........... *H03K 19/195* (2013.01); *G06N 10/40* (2022.01)

(58) Field of Classification Search
CPC ............................. H03K 19/195; G06N 10/40
USPC ......................................................... 326/1, 4
See application file for complete search history.

(56) References Cited

U.S. PATENT DOCUMENTS 10,712,408 B2 *   7/2020   Pham .................... G01N 24/12

OTHER PUBLICATIONS

Zhao et a,l Scientific Report, 2023 (Year: 2023).*
Zhao et al, Scientific Reports, Published: Dec. 15, 2023 A universal variational quantum eigensolver for non-Hermitian systems.*
Arute et al. "Observation of Separated Dynamics of Charge and Spin in the Fermi-Hubbard Model", arXiv:2010.07965v1, Oct. 15, 2020, 20 pages.
Google Quantum AI Floquet Characterization for FSIM + Microwave Circuits, Powerpoint, 20 pages.
Neill et al., "Accurately Computing Electronic Properties of a Quantum Ring", arXiv:2012.00921v2, Jun. 1, 2021, 34 pages.
Debroy et al., "Context Aware Fidelity Estimation", arXiv:2303.17565v1, 16 pages.
Gross et al., "Characterizing Coherent Errors Using Matrix-Element Amplification", arXiv:2404.12550v1, 18 pages.
International Search Report and Written Opinion for Application No. PCT/US2024/029249, mailed Sep. 9, 2024, 16 pages.
Wang et al., "Hamiltonian Tomography for Quantum Many-Body Systems With Arbitrary Couplings", arXiv:1505.00665v3, 10 pages.

* cited by examiner

*Primary Examiner* — Arnold M Kinkead
(74) *Attorney, Agent, or Firm* — DORITY & MANNING P.A.

(57) ABSTRACT

The disclosure is directed to characterizing a quantum logic circuit (QLC), via a set of intrinsic parameters. One method includes selecting control vectors that are associated with phase shifts for the intrinsic parameters such that experimental unitary operators for the QLC are defined. Each experimental unitary operator is based on the intrinsic parameters and phase shifts associated with a corresponding control vector. For each control vector, eigenvalues for the corresponding unitary operator are estimated based on qubit measurements performed subsequent to tuning the QLC in accordance with the control vector. The eigenvalues correspond to quasienergy levels of the qubits. Values for the set of intrinsic parameters may be determined based on the eigenvalues.

20 Claims, 12 Drawing Sheets

```
                                                1000
                                                  ↓
┌────────────────────────────────────────────────────────────────────────────────┐
│ Selecting a Set of Control Vectors, Wherein Each Control Vector of the Set of Vectors is │──1002
│   Associated with a Set of Phase Shifts for at Least a Subset of the Set of Intrinsic    │
│ Parameters Such That a Set of Experimental Unitary Operators for the QLC is Defined      │
│ and Each Experimental Unitary Operator of the Set of Experimental Unitary Operators is   │
│ Based on the Set of Intrinsic Parameters and a Set of Phase Shifts Associated with a     │
│              Corresponding Control Vector of the Set of Control Vectors                  │
└────────────────────────────────────────────────────────────────────────────────┘
                                                  ↓
┌────────────────────────────────────────────────────────────────────────────────┐
│ For Each Control Vector of the Set of Control Vectors, Determining a Set of Estimated    │──1004
│ Eigenvalues for the Corresponding Unitary Operator Based a Set of Qubit Measurements     │
│   Performed Subsequent to Tuning the QLC in Accordance with the Control Vector,          │
│   wherein Each Estimated Eigenvalue of the Set of Estimated Eigenvalues Corresponds to   │
│                    a Quasienergy Level of the Pair of Qubits                             │
└────────────────────────────────────────────────────────────────────────────────┘
                                                  ↓
┌────────────────────────────────────────────────────────────────────────────────┐──1006
│ For Each Control Vector of the Set of Control Vectors, Determining a Set of Quasienergy  │
│        Differences Based on the Set of Estimated Eigenvalues for the Control Vector      │
└────────────────────────────────────────────────────────────────────────────────┘
                                                  ↓
┌────────────────────────────────────────────────────────────────────────────────┐──1008
│ Determining a Set Coefficients that Define a Characteristics Polynomial for the QLC      │
│ Based on the Set of Quasienergy Differences for Each Control Vector of the Set of        │
│                                   Control Vectors                                        │
└────────────────────────────────────────────────────────────────────────────────┘
                                                  ↓
┌────────────────────────────────────────────────────────────────────────────────┐──1010
│     Generating a Cost Function Based on the Set of Coefficients and the Set of Control   │
│                                        Vectors                                           │
└────────────────────────────────────────────────────────────────────────────────┘
                                                  ↓
┌────────────────────────────────────────────────────────────────────────────────┐──1012
│ Determining Values for the Set of Intrinsic Parameters Based on an Extremum of the Cost  │
│                                       Function                                           │
└────────────────────────────────────────────────────────────────────────────────┘
```

FIG. 10

CHARACTERIZATION OF QUANTUM LOGIC CIRCUITS

FIELD

The present disclosure relates generally to quantum computing systems, and more particularly to characterizing quantum logic circuits in quantum computing systems.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$. The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a method for characterizing a quantum logic circuit (QLC) that is enabled to perform a set of quantum operations on a pair of qubits that includes a first qubit and a second qubit. The QLC may be characterized by a set of intrinsic parameters. The method may include selecting a set of control vectors. Each control vector of the set of vectors may be associated with a set of phase shifts for at least a subset of the set of intrinsic parameters such that a set of experimental unitary operators for the QLC is defined. Each experimental unitary operator of the set of experimental unitary operators may be based on the set of intrinsic parameters and a set of phase shifts associated with a corresponding control vector of the set of control vectors. For each control vector of the set of control vectors, a set of estimated eigenvalues for the corresponding unitary operator may be determined. Determining the set of estimated eigenvalues may be based on a set of qubit measurements performed subsequent to tuning the QLC in accordance with the control vector. Each estimated eigenvalue of the set of estimated eigenvalues may correspond to a quasienergy level of the pair of qubits. For each control vector of the set of control vectors, a set of quasienergy level differences may be determined based on the set of estimated eigenvalues for the control vector. A set of coefficients that define a characteristic polynomial for the QLC may be determined. Determining the set of coefficients may be based on the set of quasienergy level differences for each control vector of the set of control vectors. A cost function may be generated based on the set of coefficients and the set of control vectors. Values for the set of intrinsic parameters may be determined based on an extremum of the cost function.

Other aspects of the present disclosure are directed to various systems, methods, apparatuses, non-transitory computer-readable media, computer-readable instructions, and computing devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, explain the related principles.

BRIEF DESCRIPTION OF THE DRAWINGS

Detailed discussion of embodiments directed to one of ordinary skill in the art is set forth in the specification, which refers to the appended figures, in which:

FIG. 10 depicts a flow diagram of an example method for characterizing a quantum logic circuit, according to various embodiments.

DETAILED DESCRIPTION

Figure 1:
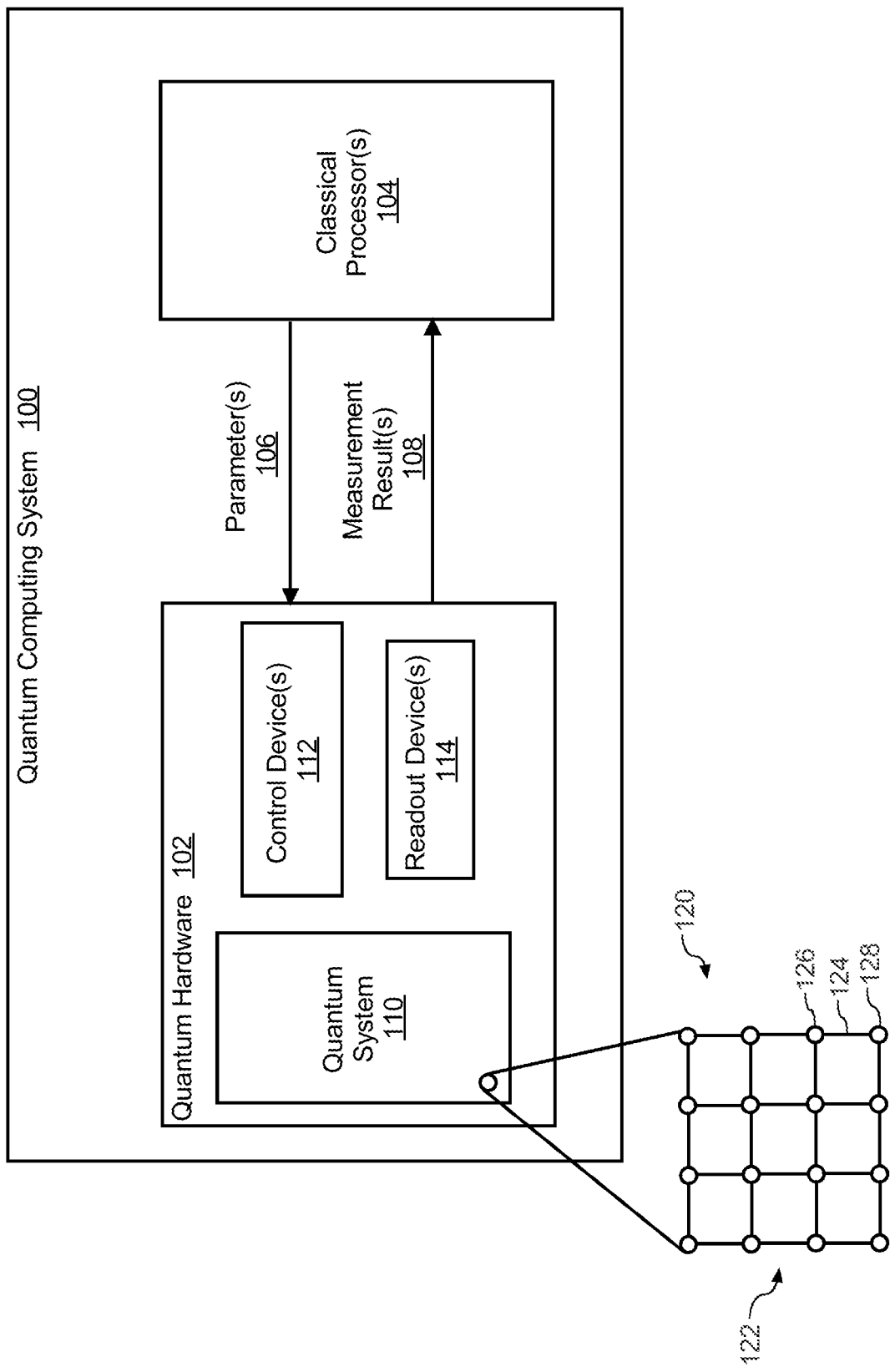
FIG. 1 depicts an example quantum computing system according to example embodiments of the present disclosure.

Example aspects of the present disclosure are directed to enhanced systems and methods for characterizing (e.g., calibrating) quantum logic gates. The gates may be arranged in a quantum logic circuit (QLC). Thus, a QLC may be characterized via the various embodiments. Characterizing a QLC, according to the embodiments, may include determining values for a set of intrinsic parameters for the gates of the QLC. The characterization of the QLC may be "context" dependent, where the "context" of the QLC is characterized via the spatial and/or temporal arrangement (or configuration) of the gates making up the QLC. The gates that are used to construct a characterizable QLC may include single-qubit gates, as well as two-qubit gates. The two-qubit gates may affect the entanglement of the two qubits. Thus, two-qubit gates may be referred to as entangling gates. In various embodiments, a two-qubit gate may be implemented via a fermionic simulation (fSim) gate. Single-qubit gates may be implemented via microwave (e.g., µwave) gates that are operated via µwave signals. Characterizing a QLC may include determining the rotation angles introduced by the gates operating on the qubits based on the context of the gates.

In the various embodiments, a unitary operator (corresponding to a QLC) describes the operations the QLC performs on a qubit pair. That is, the unitary operator (and thus the corresponding QLC) indicates the evolution of a two-qubit input quantum state vector. The unitary operator is parameterized by the set of intrinsic parameters of the QLC. Each intrinsic parameter indicating a rotation angle (and rotation axis) in a Bloch sphere (or hyper-Bloch sphere) representation of the qubits' quantum state. Thus, the unitary operator performs an ordered series of rotational operations on a complex input vector describing the quantum state of a two-qubit system. Note that in general, rotational operations do not commute. The two qubits may be entangled qubits and the rotations associated with a two-qubit gate may affect the entanglement of the two-qubit system.

In various embodiments, a set of control parameters for a QLC is provided. Control parameters may be referred to as control knobs throughout. The control parameters allow for the introduction of phase shifts into the rotations of at least some of the intrinsic parameters. Such phase shifts may be precisely introduced via microwave signals to the QLC. Thus, control parameters provide a means for "tuning" a QLC, via a set of phase shifts introduced by selectively providing microwave signals to the corresponding gates of the QLC. Single qubit operations may include $R_X$ and $R_Z$ rotations, while two-qubit operations may include entangling rotations. Note that $R_X$ and $R_Z$ are single-qubit rotations about the qubit's Bloch sphere: $R_X$ being a rotation about the Bloch sphere's x-axis, while $R_Z$ being a rotation about the Bloch sphere's z-axis. In some embodiments, the set of intrinsic parameters may include seven independent parameters, two of which are associated with $R_X$ operations, three of which are associated with $R_Z$ operations, and the other two of which are associated with entangling operations. One of the two entangling parameters providing rotations between the "odd parity" eigenstate ($|01\rangle$, $|10\rangle$), and the other entangling parameter providing a phase shift in the "even parity" eigenstate ($|11\rangle$). Thus, the two-qubit operations are "parity-conserving" (or "excitation-conserving") operations, while the single-qubit operations are not parity-conserving operations.

The control parameters provide a phase shift to each of the three single-qubit $R_Z$ rotations. Thus, a control parameter may be encoded in a 3D control vector (e.g., a Z vector). In addition to being parameterized by the seven intrinsic parameters, the unitary operator may be further parameterized by the three phase shifts of the control parameter (e.g., the three components of the control vector). When tuned, via a choice of a control vector, the corresponding unitary operator may be referred to as an experimental unitary operator because experimental measurements are made to determine the set of intrinsic parameters.

Each experimental unitary operator has a set of eigenvectors (or eigenstates) for the two-qubit system. Each eigenstate has an associated eigenvalue (e.g., a quasienergy level of the eigenstate). The experimental unitary operator indicates how an eigenstate (or a quantum state corresponding to a superposition of eigenstates) evolves as the QLC operates on the pair of qubits. The experimental unitary operator also indicates how an observable (e.g., of the pair of qubits) evolves as the circuit operates on the pair of qubits. For an initial state that is a superposition of two of the experimental unitary operator's four eigenstates, under d repeated operations of the QLC (e.g., a circuit depth of d), the evolution of an observable of the initial state is dependent upon d and a phase shift associated with the quasienergy level difference between the two eigenstates.

In various embodiments, a QLC is characterized by selecting a few choices (e.g., at least three) for the control vector. Every choice of a control vector has an associated experimental unitary operator. For each choice of a control vector, an initial estimate of the set of intrinsic parameters is generated. Estimates of the eigenstates and associated eigenvalues are generated based on the initial estimates of the intrinsic parameters and the components of the selected control vector. Using these eigenvalues, coefficients for a characteristic polynomial of the experimental unitary operator are determined. The polynomial coefficients (for each choice of the control vector) are inputted into a cost function. An extreme (e.g., a minimum) of the cost function is found. Based on the extrema of the cost function, values for the set of intrinsic parameters are determined.

Although throughout, the discussion is focused on a QLC that includes a single fSim gate and two microwave gates (with more microwave (e.g., single-qubit operations) embedded in the fSim gate), the embodiments are not so limited. That is, the various characterization methods presented within may be extended to QLC that include other arrangements of two-qubit and single-qubit gates. For instance, a QLC with two or more fSim gates and/or three or more microwave gates may be characterized by various generalizations of the methods discussed within, without deviating from the scope of the embodiments.

Aspects of the present disclosure provide a number of technical effects and benefits. For instance, previous methods for characterizing QLCs include characterizing each gate of a QLC separately from the other gates. That is, these previous methods do not include characterizing a circuit based on its context. The various embodiments are an improvement over these previous methods because, in the embodiments, the spatial and/or temporal context of the circuit is factored into the characterization. Additionally, the embodiments leverage the excitation-conserving nature of fSIm gates. In contrast, previous methods employ unitary operators that change the number of excitations in the qubits. Some previous methods (e.g., cross-entropy benchmarking) do not amplify errors coherently. In contrast, the embodiments achieve improved scaling of precision with depth by amplifying errors coherently.

FIG. 1 depicts an example quantum computing system 100. The system 100 is an example of a system of one or more classical computers and/or quantum computing devices in one or more locations, in which the systems, components, and techniques described below can be implemented. Those of ordinary skill in the art, using the disclosures provided herein, will understand that other quantum computing devices or systems can be used without deviating from the scope of the present disclosure.

The system 100 includes quantum hardware 102 in data communication with one or more classical processors 104. The classical processors 104 can be configured to execute computer-readable instructions stored in one or more memory devices to perform operations, such as any of the operations described herein. The quantum hardware 102 includes components for performing quantum computation. For example, the quantum hardware 102 includes a quantum system 110, control device(s) 112, and readout device(s) 114 (e.g., readout resonator(s)). The quantum system 110 can include one or more multi-level quantum subsystems, such as a register of qubits (e.g., qubits 120). In some implementations, the multi-level quantum subsystems can include superconducting qubits, such as flux qubits, charge qubits, transmon qubits, gmon qubits, spin-based qubits, and the like.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits. In other cases, ion traps, photonic devices or superconducting cavities (e.g., with which states may be prepared without requiring qubits) may be used. Further examples of realizations of multi-level quantum subsystems include fluxmon qubits, silicon quantum dots or phosphorus impurity qubits.

Quantum circuits may be constructed and applied to the register of qubits included in the quantum system 110 via multiple control lines that are coupled to one or more control devices 112. Example control devices 112 that operate on the register of qubits can be used to implement quantum gates or quantum circuits having a plurality of quantum gates, e.g., Pauli gates, Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines to generate magnetic fields to adjust the frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum system 102 through physical control parameters (e.g., microwave pulses) that are sent through wires included in the quantum hardware 102. Further examples of control devices include arbitrary waveform generators, wherein a DAC (digital to analog converter) creates the signal.

The readout device(s) 114 may be configured to perform quantum measurements on the quantum system 110 and send measurement results 108 to the classical processors 104. In addition, the quantum hardware 102 may be configured to receive data specifying physical control qubit parameter values 106 from the classical processors 104. The quantum hardware 102 may use the received physical control qubit parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

In some implementations, the readout device(s) 114 can take advantage of a difference in the impedance for the $|0\rangle$ and $|1\rangle$ states of an element of the quantum system, such as a qubit, to measure the state of the element (e.g., the qubit). For example, the resonance frequency of a readout resonator can take on different values when a qubit is in the state $|0\rangle$ or the state $|1\rangle$, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

In some embodiments, the quantum system 110 can include a plurality of qubits 120 arranged, for instance, in a two-dimensional grid 122. For clarity, the two-dimensional grid 122 depicted in FIG. 1 includes 4×4 qubits, however in some implementations the system 110 may include a smaller or a larger number of qubits. In some embodiments, the multiple qubits 120 can interact with each other through multiple qubit couplers, e.g., qubit coupler 124. The qubit couplers can define nearest neighbor interactions between the multiple qubits 120. In some implementations, the strengths of the multiple qubit couplers are tunable parameters. In some cases, the multiple qubit couplers included in the quantum computing system 100 may be couplers with a fixed coupling strength.

In some implementations, the multiple qubits 120 may include data qubits, such as qubit 126 and measurement qubits, such as qubit 128. A data qubit is a qubit that participates in a computation being performed by the system 100. A measurement qubit is a qubit that may be used to determine an outcome of a computation performed by the data qubit. That is, during a computation an unknown state of the data qubit is transferred to the measurement qubit using a suitable physical operation and measured via a suitable measurement operation performed on the measurement qubit.

In some implementations, each qubit in the multiple qubits 120 can be operated using respective operating frequencies, such as an idling frequency and/or an interaction frequency and/or readout frequency and/or reset frequency. The operating frequencies can vary from qubit to qubit. For instance, each qubit may idle at a different operating frequency. The operating frequencies for the qubits 120 can be chosen before a computation is performed.

FIG. 1 depicts one example quantum computing system that can be used to implement the methods and operations according to example aspects of the present disclosure. Other quantum computing systems can be used without deviating from the scope of the present disclosure.

Figure 2A:
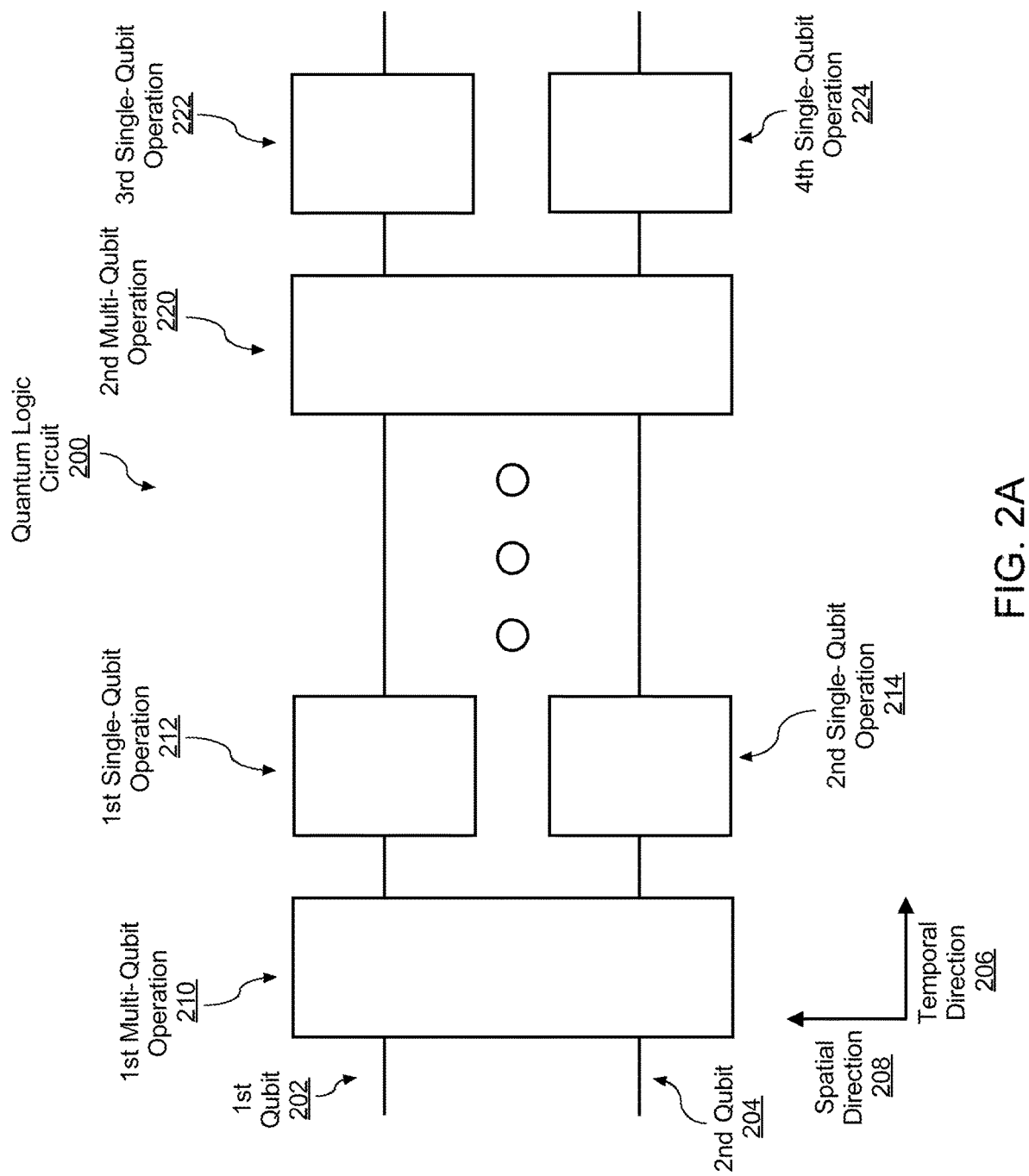
FIG. 2A depicts a generalized quantum logic circuit that is characterizable via the various embodiments of the present disclosure.

FIG. 2A depicts a generalized quantum logic circuit (QLC) 200 that is characterizable via the various embodiments of the present disclosure. QLC 200 performs an ordered (e.g., ordered both spatially and temporally) set of qubit operations on a pair of qubits (e.g., a first qubit 202 and a second qubit 204). The temporal ordering of the set of operations is indicated by the temporal direction 206, while the spatial ordering of the set of operations is indicated by the spatial direction 208 shown in FIG. 2. The temporal and spatial ordering of the set of operations is indicative of a "context" for the QLC 200. The characterizations of the QLC 200 (e.g., performed by the various embodiments) may be a function of the context of QLC 200. That is, if the ordered set of operations is changed (e.g., spatially and/or temporally), the characterization of the QLC 200 may change.

The qubit operations may include multi-qubit operations (e.g., two-qubit operations), as well as single-qubit operations. For instance, in the non-limiting example shown in FIG. 2A, the set of qubit operations includes a first multi-qubit operation 210 and a second multi-qubit operation 220, each operating on the pair of qubits. The set of qubit operations also includes a first single-qubit operation 212, a second single-qubit operation 214, a third single-qubit operation 222, and a fourth single-qubit operation 224. The first single-qubit operation 212 and the third single-qubit operation 222 operate on the first qubit 202. The second single-qubit operation 214 and the fourth single-qubit operation 224 operate on the second qubit 204. In some embodiments, the first single-qubit operation 212 and the second single-qubit operation 214 may be parallel operations. Similarly, the third single-qubit operation 222 and the fourth-qubit operation 224 may be parallel operations. In other embodiments, these operations may be serial operations. There may be additional qubit operations occurring between the first multi-qubit operations 210 and the second multi-qubit operation 220.

The single-qubit operations may generate one or more rotations about the corresponding qubit's Bloch sphere. The multi-qubit (e.g., two-qubit) operations may be entangling operations that affect the state of the two-qubit system of the corresponding qubit pair. That is, the multi-qubit operations may affect the entanglement of the two qubits. Thus, the multi-qubit operations may generate one or more rotations about the qubit pair's hyper-Bloch sphere. In some embodiments, one or more single-qubit operations may be implemented via one or more single-qubit logic gates (e.g., a microwave gate). Because single-qubit gates may be operated via microwave signals, single qubit logic gates may be referred to throughout as microwave (e.g., $\mu$wave) gate. In some embodiments, one or more multi-qubit operations may be implemented by one or more multi-qubit logit gates (e.g., an fSim gate). One or more single-qubit operations may also be performed via multi-logic gates. Due to one or more gauge freedoms of the QLC 200, QLC 200 may be invariant as to whether the single-qubit operations (e.g., rotations) are performed via a single-qubit logic gate or a multi-qubit logic gate. Characterizing the QLC 200 may include determining parameter values that indicate the rotations around the Bloch sphere and/or hyper Bloch sphere representations of the quantum states of the qubits. Throughout, at least a subset of various rotations may also be referred to as phase shifts.

Figure 2B:
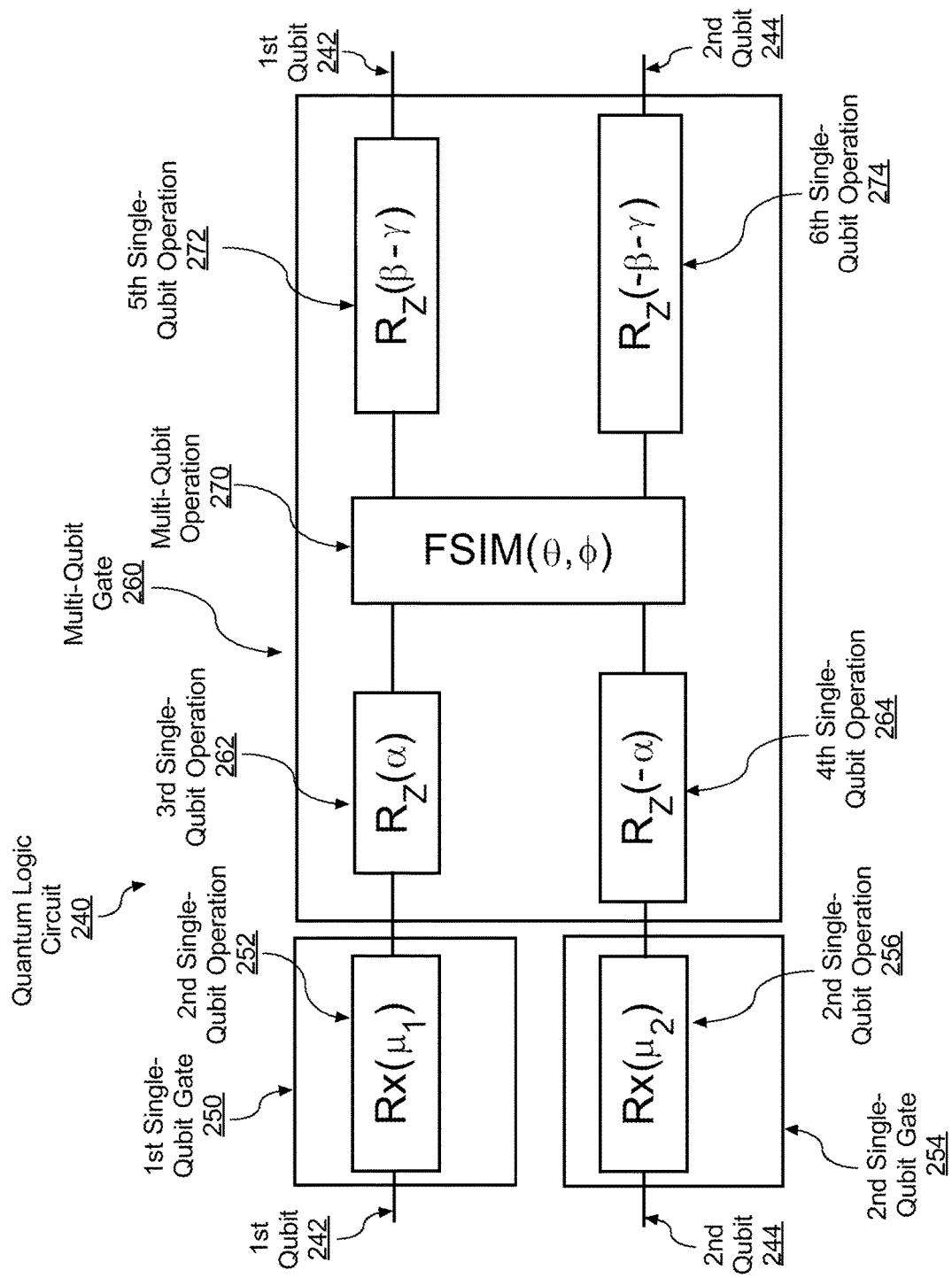
FIG. 2B depicts another generalized quantum logic circuit that is characterizable via the various embodiments of the present disclosure.

FIG. 2B depicts another generalized quantum logic circuit (QLC) 240 that is characterizable via the various embodiments of the present disclosure. QLC 240 may be similar to QLC 200 of FIG. 200, in that QLC 240 performs an ordered set of operations on a qubit pair (e.g., a first qubit 242 and a second qubit 244). QLC 240 includes a first single-qubit gate 250, a second single-qubit gate 254, and a multi-qubit gate 260 (e.g., an entanglement gate). First single-qubit gate 250 performs a first single-qubit operation 252 (e.g., $R_X(\mu_1)$) on the first qubit 242. Note that $R_X(\mu_1)$ indicates a rotation (e.g., of rotation angle $\mu_1$ about the X-axis of a Bloch sphere representation) of the quantum state of the corresponding qubit. Second single-qubit gate 254 performs a second single-qubit operation 256 (e.g., $R_X(\mu_2)$) on the second qubit 244.

The multi-qubit gate 260 performs a third single-qubit operation 262 (e.g., $R_Z(\alpha)$) on the first qubit 242. Note that $R_Z(\alpha)$ indicates a rotation (e.g., of rotation angle $\alpha$ about the Z-axis of a Bloch sphere representation) of the quantum state of the corresponding qubit. The multi-qubit gate 260 performs a fourth single-qubit operation 264 (e.g., $R_Z(-\alpha)$) on the second qubit 242. The multi-qubit gate 260 then performs a multi-qubit operation 270 (e.g., $FSIM(\theta, \varphi)$) on the qubit pair, where ($\theta$, $\varphi$) is a pair of entangling-rotation parameters for the qubit pair (e.g., $\theta$ indicates a "mixing" of the odd-parity (or odd-excitation) states of the qubit pair and $\varphi$ is a phase shift in the $|11\rangle$ state). The multi-qubit gate 260 then performs a fifth single-qubit operation 272 (e.g., $R_Z(\beta-\gamma)$) on the first qubit 242 and a sixth single-qubit operation 274 (e.g., $R_Z(-\beta-\gamma)$) on the second qubit 244. Due to gauge invariances, the third single-qubit operation 262 may be implemented in the first single-qubit gate 250 and/or the fourth single qubit operation 264 may be implemented in the second single-qubit gate 254. Likewise, the fifth single-qubit operation 272 and/or the sixth single-qubit operation 274 may be implemented in additional downstream single-qubit gates. Because the $R_X(\mu)$ operations (e.g., rotations) may be implemented via microwave ($\mu$wave) signals, the single qubit gates may be referred to as microwave gates.

Figure 2C:
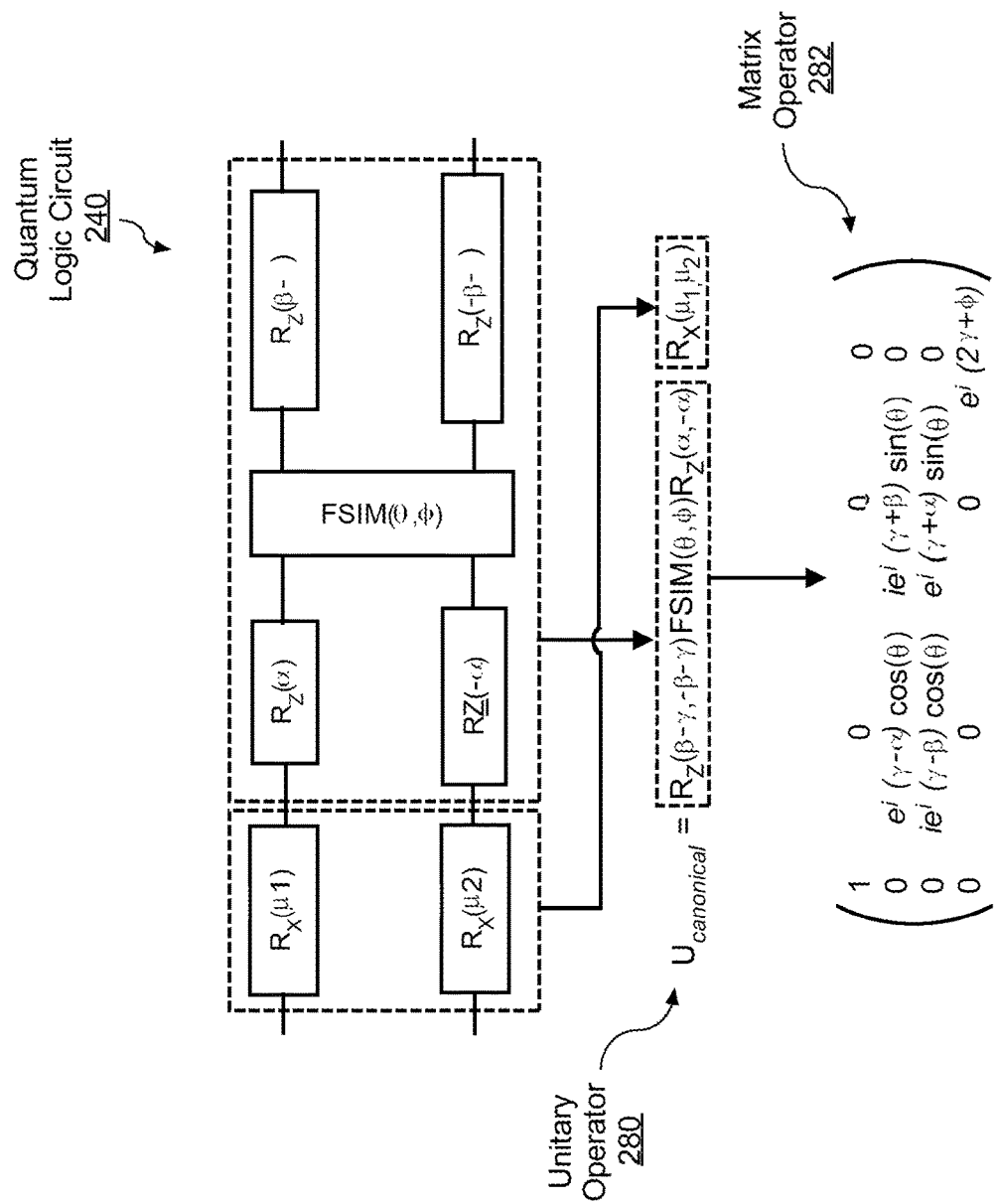
FIG. 2C depicts a parameterized unitary operator corresponding to the generalized quantum logic circuit of FIG. 2B, according to various embodiments of the present disclosure.

FIG. 2C depicts a parameterized unitary operator 280 corresponding to the generalized quantum logic circuit (QLC) 240 of FIG. 2B, according to various embodiments of the present disclosure. The hashed box surrounding the first two terms of the unitary operator 280 corresponds to the operations of the multi-qubit gate of QLC 240 (as shown by the hashed box of QLC 240). The matrix operator 282 corresponds to the first two terms of the unitary operator 280. Characterization of QLC 240 includes determining values for the seven rotational parameters: ($\mu_1$, $\mu_2$, $\alpha$, $\beta$, $\theta$, $\varphi$, $\gamma$). Because the rotational parameters are intrinsic to the gates of QLC 240, the rotational parameters may be referred to as a set on intrinsic parameters of the QLC 240.

The inclusion of the microwave gates may introduce difficulties in determining the parameters for characterization. For instance, there is no obvious reference state for the $|00\rangle$ state to estimate the associated phase. Additionally, the inclusion of the $R_X(\mu_1, \mu_2)$ would render the matrix operator 280 no longer block diagonal, requiring the extraction of the seven rotational parameters together. Thus, the characterization of QLC 240 is "context" dependent.

Figure 3:
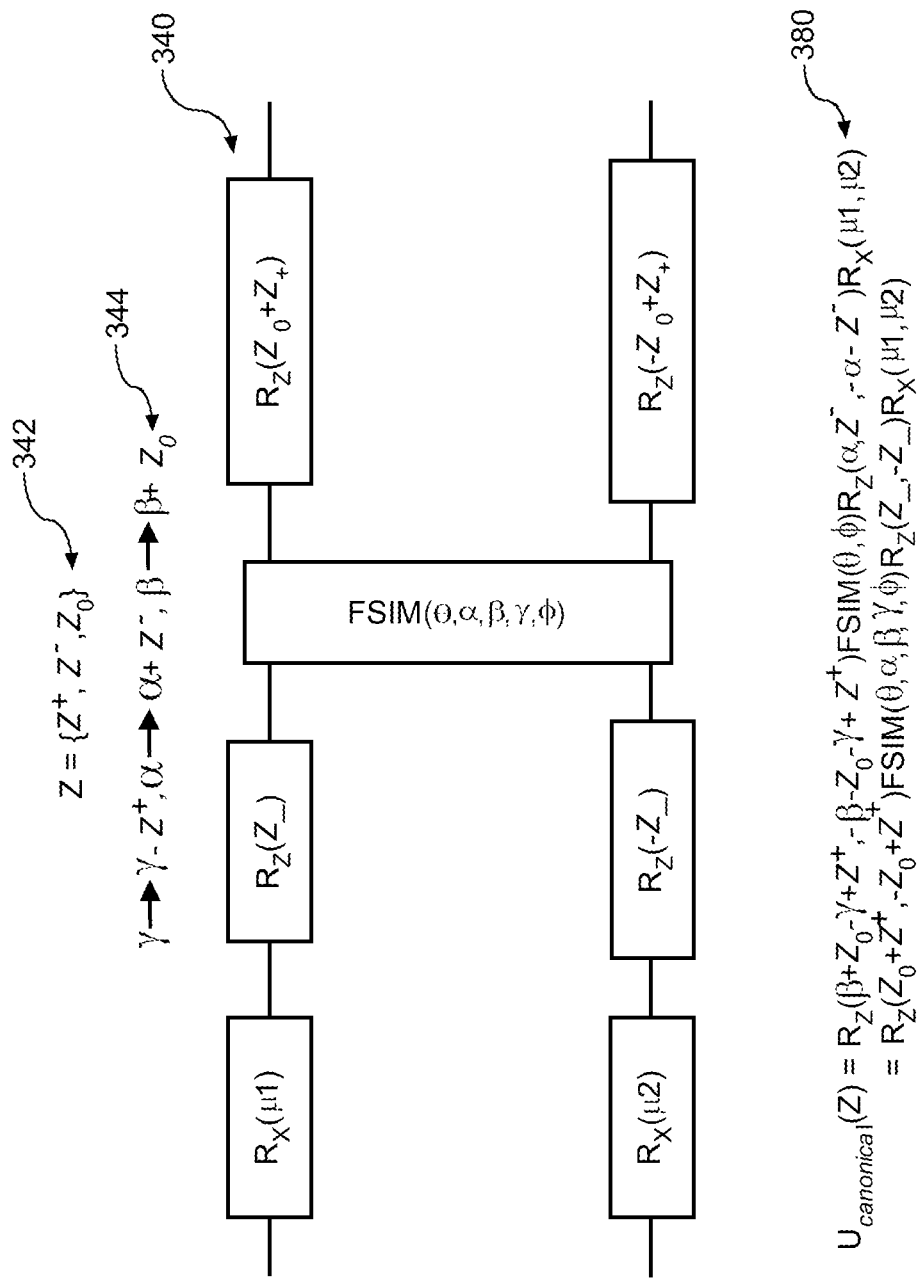
FIG. 3 depicts control parameters employed for the characterization of a quantum logic circuit according to various embodiments.

FIG. 3 depicts control parameters employed for the characterization of a quantum logic circuit (QLC) 340 according to various embodiments. More specifically, QLC 340 is similar to QLC 240 of FIGS. 2B-2C, except that a set of phase shifts (e.g., set of phase shifts 344) have been introduced to the $R_Z$ operations (or rotations) of QLC 340. A setting for a control parameter (for controlling QLC 340) may be encoded in a control vector 342 (e.g., a 3D z-vector). The components of the control vector 342 include the set of phases shifts 344 to the set of intrinsic parameters of the QLC 340. Note that the set of phase shifts 344 of the control vector 342 includes phase shifts (or rotations) in the $R_Z$ operations of the QLC 340. The unitary operator 380 for the QLC 340 is also shown in FIG. 3. Note that the unitary operator 380 has been modified to account for the components (e.g., phase shifts) of the control vector 342. QLC 340 may be "tuned" to introduce the set of phase shifts 344 via microwave signals applied to QLC 340. The unitary operator 380 may be referred to as an experimental unitary operator. As discussed in further detail in conjunction with at least FIG. 4, QLC 340 may be characterized by selecting at least three different choices for the components for control vector 342, (e.g., a total of nine phase shifts). The QLC 340 is tuned (e.g., via microwave signals) to each of the three choices of the control vector 342, such that the QLC 340 operates on a qubit pair according to three corresponding versions of the unitary operator 380. Based on qubit measurements performed with the three versions of the tuned QLC 340, eigenvectors (and corresponding eigenvalues) for each of the three versions of unitary operator 380 are estimated. Based on these estimates, values for the set of intrinsic parameters may be determined as discussed below.

Figure 4:
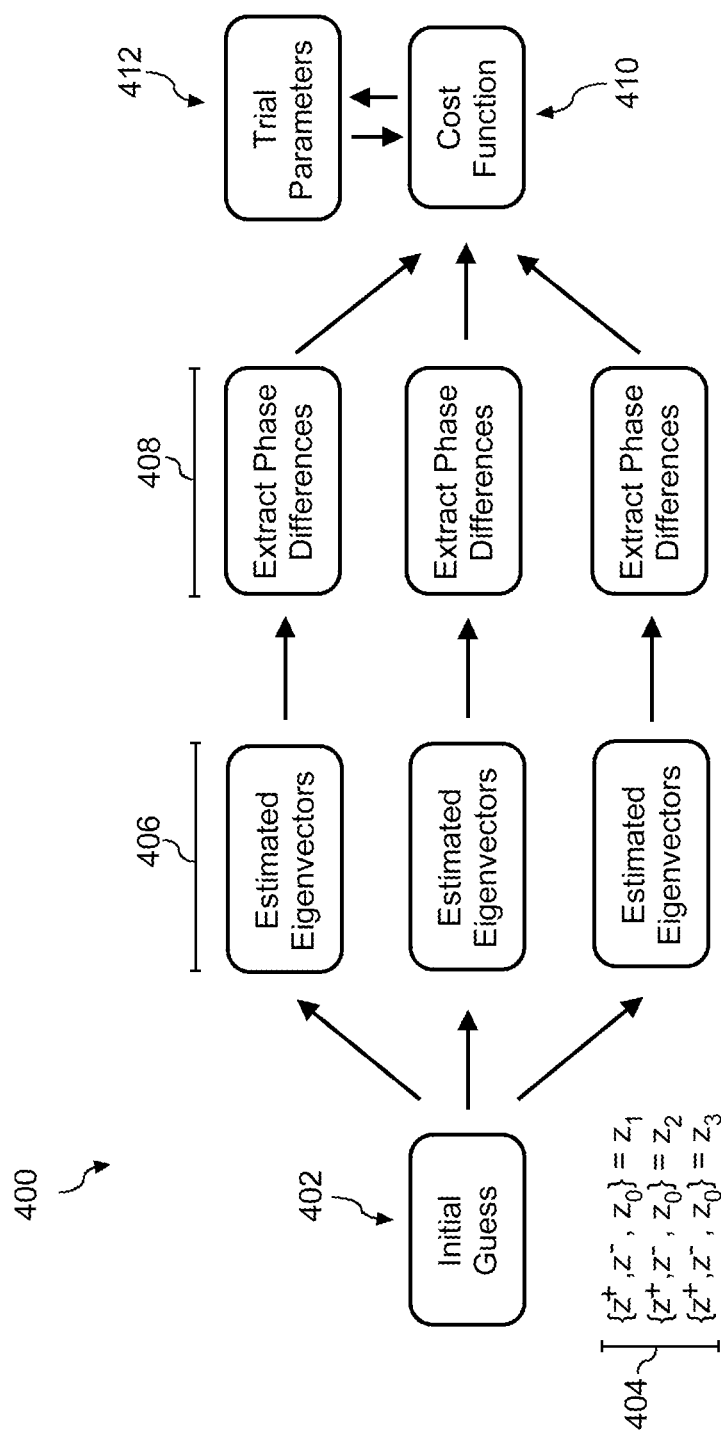
FIG. 4 shows a generalized scheme for characterizing a quantum logic circuit, according to the various embodiments.

FIG. 4 shows a generalized scheme 400 for characterizing a quantum logic circuit (QLC), according to the various embodiments. For instance, QLC 200 FIG. 2A, QLC 240 of FIGS. 2B-2C, and/or QLC 340 of FIG. 3 may be characterized via scheme 400. Characterizing a QLC may include determining values for its set of intrinsic parameters. In conjunction with FIG. 4, the steps of scheme 400 are discussed in general. Additional details for each of the steps are discussed in conjunction with at least FIGS. 5-9. In scheme 400, at step 402, a set of initial guesses is determined for the set of intrinsic parameters. The set of initial guesses may be determined from expected values, previous experience, or other such means. At step 404, at least 3 three choices for the components of the control vector (e.g., control vector 342 of FIG. 3) are made. At step 406, estimates for the eigenvectors (e.g., eigenstates) of the corresponding experimental unitary operators (e.g., unitary operator 380) are made for each choice of the control vector. In addition to estimating the eigenvectors (or eigenstates), estimates for the corresponding eigenvalues (or quasienergy levels) are made for each of the eigenvectors are made. As discussed in conjunction with at least FIG. 5, the eigenvalues of the eigenvectors may correspond to "quasienergies" of the eigenvectors. At step 408, phase differences (or phase shifts) between the eigenvalues are extracted. The extraction of the phase differences are discussed in conjunction with at least FIGS. 6-7. However, briefly here, initial states of superpositions of various combinations of two eigenstates are prepared on a two-qubit system. The QLC is repeatedly applied to the qubit pair and measurements of various observables (which depend upon the phase differences) are made. The phase differences (between the eigenstates) are determined via a Fourier analysis of the data generated from the measurements. The phase differences are employed to generate coefficients of a characteristic polynomial for the unitary operator. At step 410, the polynomial coefficients are input into a cost function. The characteristic polynomial and the cost function are discussed in conjunction with at least FIG. 8. At step 412, the cost function is optimized (e.g., minimized) to determine values for the set of intrinsic parameters, as shown in FIG. 9.

Figure 5:
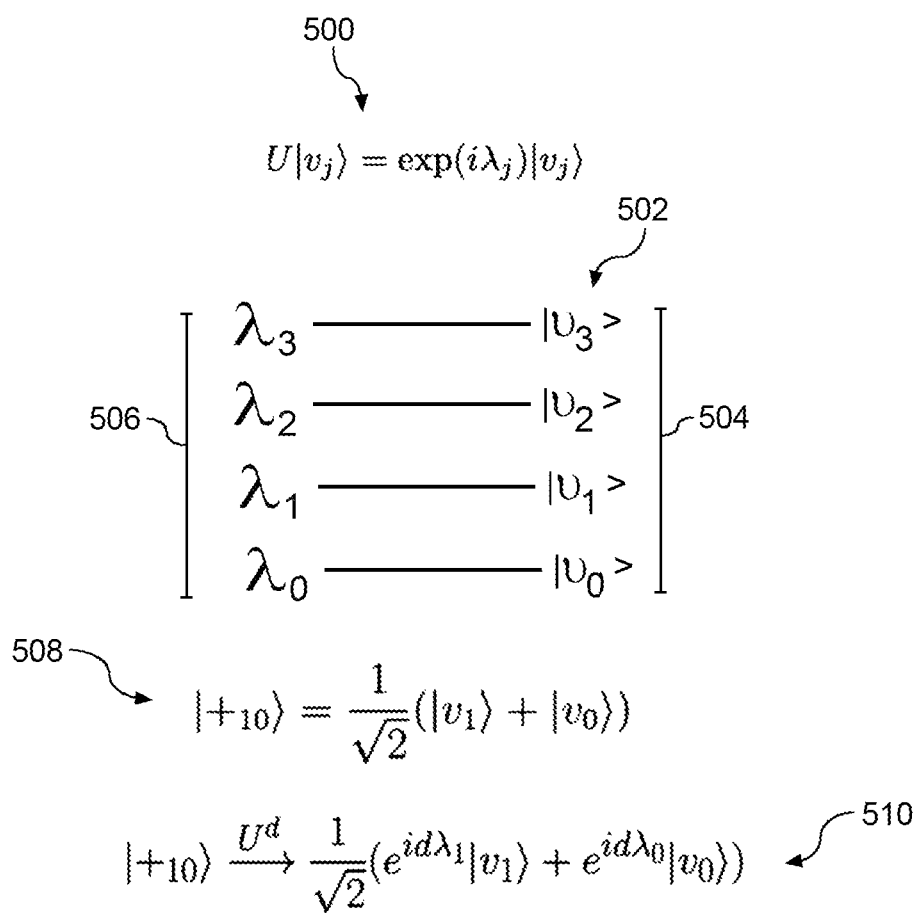
FIG. 5 shows the eigenstates for the unitary operator of the quantum logic circuit of FIGS. 2A-2C, according to various embodiments.
Figure 7:
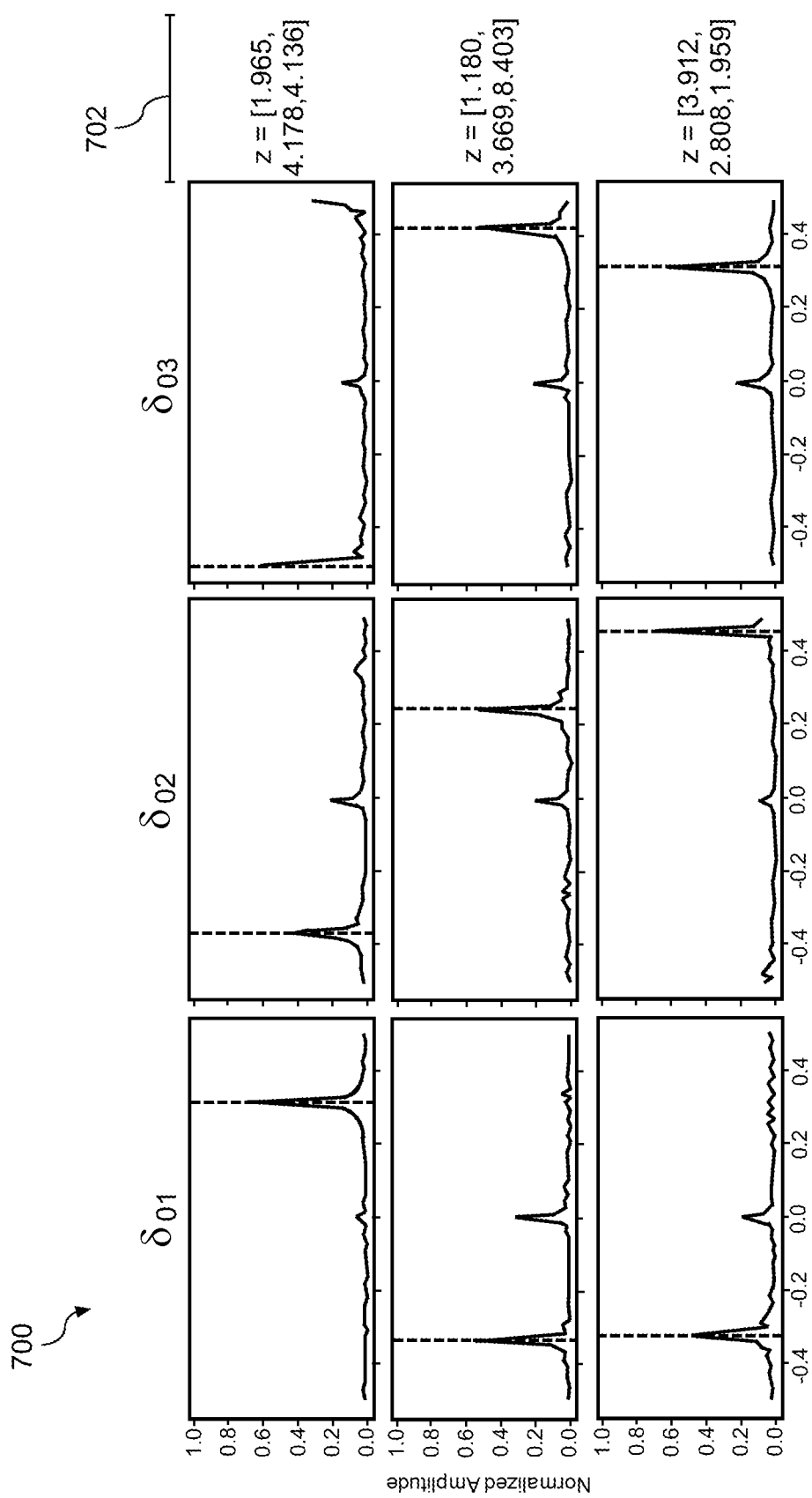
FIG. 7 shows a Fourier analysis for extracting the phase differences for eigenstates based on experimental data, according to various embodiments.

FIG. 5 shows the eigenstates for the unitary operator of the quantum logic circuit (QLC) of FIGS. 2A-2C, according to various embodiments. Equation 500 is the general equation for the eigenstates (or eigenvectors) of a unitary operator (e.g., unitary operator 280 of FIG. 2). Plot 502 shows the four eigenstates 504 (or eigenvectors) and corresponding eigenvalues 506, which are solutions to equation 500. The eigenvalues 506 may be referred to as quasienergy values for the eigenvectors 504. State 508 is an odd-parity (or odd-excitation) superposition of two of eigenstates 504. Note that the two-qubit entangling gates of the various embodiments conserve the odd parity (or odd excitation) of state 508. Likewise, the entangling gates would conserve even parity (or even excitation) of an even-parity state. The parity of a two-qubit system may not be invariant to $R_X$ or $R_Z$ rotations of the single-qubit gates. Via equation 510, preparing two-state superpositions of the eigenstates enables separately estimating the individual quasienergy level differences (e.g., eigenvalues 506 of the eigenstates 504). As shown in FIG. 7, phase differences associated with the quasienergy level differences may be inferred from single peaks in the frequency domain. Additionally, equation 510 indicates how the state 508 evolves under a single application of the unitary operator. Given the four eigenstates and eigenvalues, there are a total of six (e.g., $$\binom{4}{2}$$

quasienergy level differences, only three of which are independent.

Figure 6:
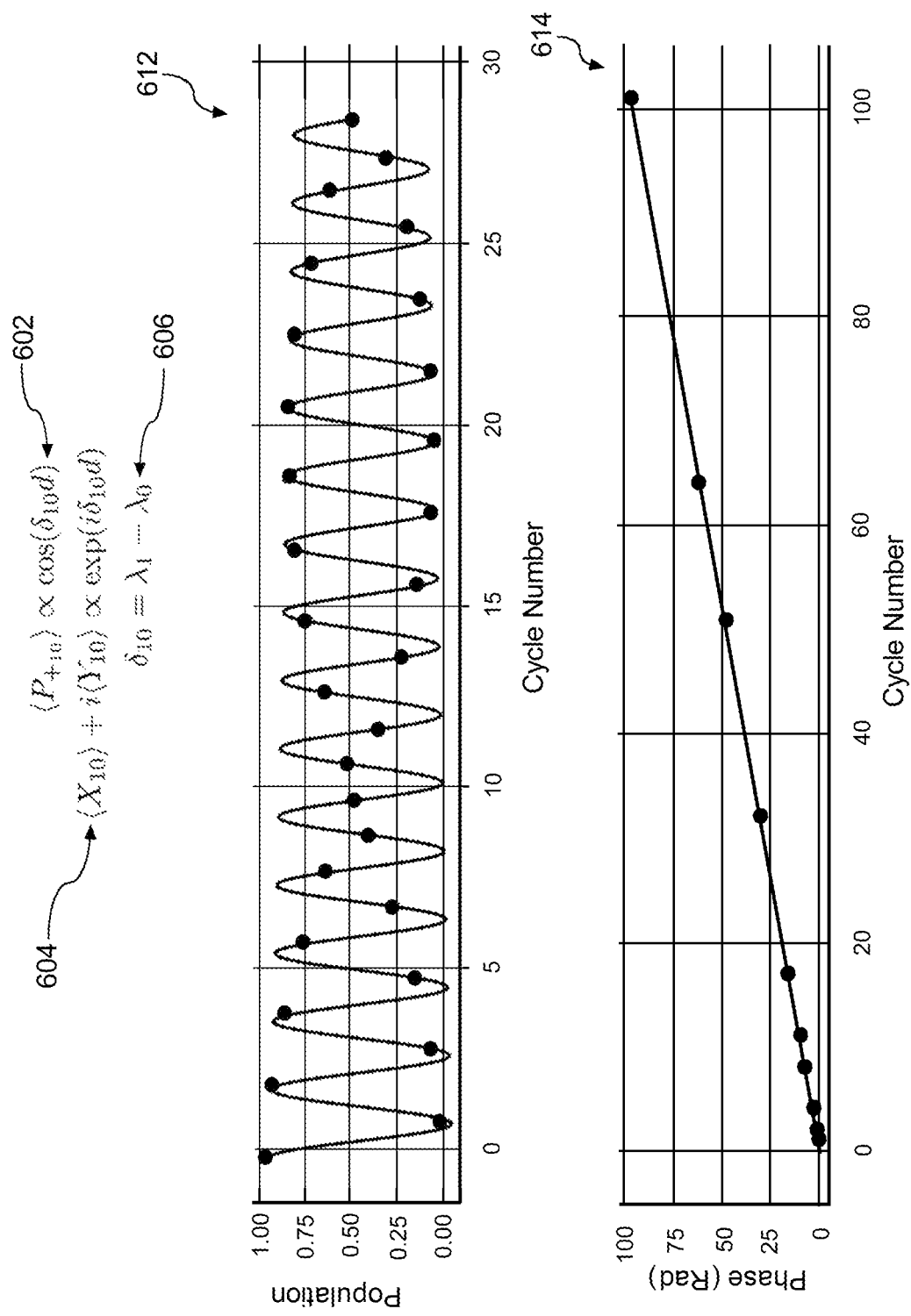
FIG. 6 shows an experimental method for extracting the quasienergy level differences for eigenstates based on experimental data, according to various embodiments.

FIG. 6 shows an experimental method for extracting the quasienergy level differences for eigenstates based on experimental data, according to various embodiments. Equation 606 defines one of the six possible quasienergy level differences for the eigenstates 504 of FIG. 5. The quasienergy level difference in equation 606 may be an independent quasienergy level difference. Determination of it (via a Fourier analysis) as well as the determination of two other independent differences is shown in FIG. 7. Quasienergy level differences may be referred to as phase differences (or phase shifts), as indicated by the delta notation. Equation 602 shows the expectation value for the population of qubits observed in the state 508, after being operated on by the QLC with a circuit depth d (e.g., the application of the QLC is repeated d times on the qubit pair). Plot 612 demonstrates experimental data, in accordance with equation 602, where the y-axis corresponds to the expectation value of equation 602 and the x-axis corresponds to the circuit depth. Equation 604 shows another expectation value of a linear combination of the X and Y observables. Plot 614 demonstrates experimental data, in accordance with equation 604. Note that the equations and experimental data shown in FIG. 6 are with respect to the qubit pair being initially prepared in the state of 508 of FIG. 5. To determine the quasienergy level differences between the other two independent quasienergy level differences, the qubit pair may be initially prepared in corresponding superpositions. Furthermore, the dependence of corresponding observables may be similarly determined. For plot 612, the maximum circuit depth is d=28, while for plot 614, the maximum circuit depth is d=101. As shown in FIG. 7, the phase differences (or quasienergy level differences) may be extracted via a Fourier analysis of the experimental data.

FIG. 7 shows a Fourier analysis for extracting the phase differences for eigenstates based on experimental data, according to various embodiments. The set of plot2 700 shows the Fourier transforms of the experimental data (of FIG. 6) for three separate choices of control vectors 702 (for three independent quasienergy level differences). The primary peak in each plot of the set of plots 700 indicates the quasienergy level difference (for the corresponding control vector and two eigenstates).

Figure 8:
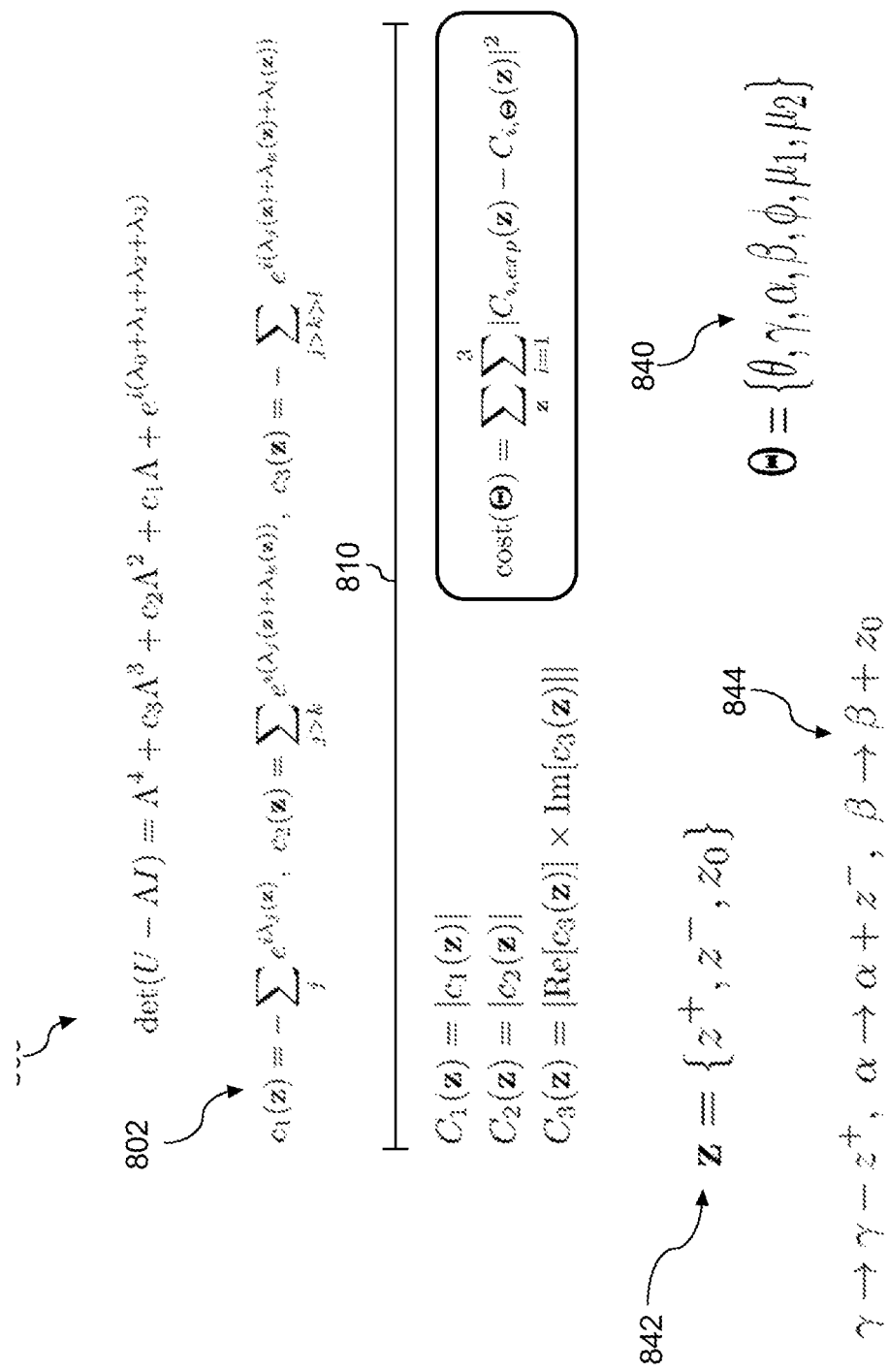
FIG. 8 shows the determination of a characteristic polynomial for a unitary operator and corresponding cost function, according to various embodiments.
Figure 9:
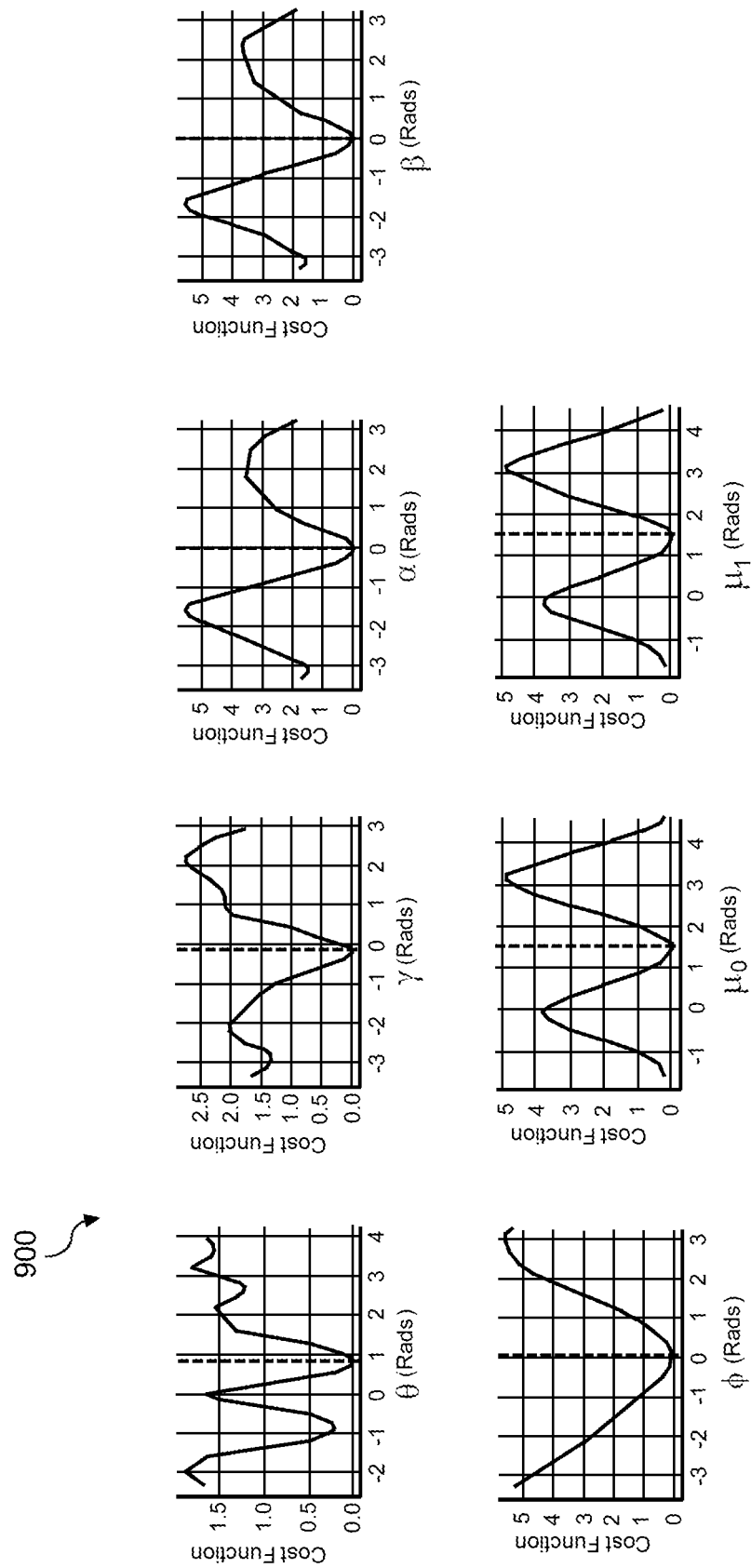
FIG. 9 shows a minimization process for the cost function of FIG. 8, according to various embodiments.

FIG. 8 shows the determination of a characteristic polynomial for a unitary operator and corresponding cost function, according to various embodiments. Equation 800 defines a characteristic polynomial for a unitary operator. Set of equations 804 shows the determination of polynomial coefficients for the characteristic polynomial, as a function of the control vector 842 and the quasienergy of the eigenstates. Equations 810 show the definition of the cost function, as function of the polynomial coefficients 802 and set of intrinsic parameters 840. The definition of phase shifts 844 introduced via the control vector 842 is provided for reference.

FIG. 9 shows a minimization process for the cost function of FIG. 8, according to various embodiments. The set of plots 900 show 1D slices of the scalar field defined over the 7D space of the set of intrinsic parameters 840 of FIG. 8. The scalar field being defined via the equations 810 (defining the cost function 810 of FIG. 8). Determining values for the set of intrinsic parameters may be based on finding a global extremum (e.g., a minimum) of the scalar field. Finding the global extremum may be accomplished via one or more gradient descent methods.

FIG. 10 depicts operations performed in a particular order for purposes of illustration and discussion. Those of ordinary skill in the art, using the disclosures provided herein, will understand that operations of any of the methods described herein can be expanded, include steps not illustrated, omitted, rearranged, and/or modified in various ways without deviating from the scope of the present disclosure. Various portions or steps of method 1000 of FIG. 10 may be implemented by a quantum computing system (e.g., quantum computing system 100 of FIG. 1).

FIG. 10 depicts a flow diagram of an example method 1000 for characterizing a quantum logic circuit (QLC) according to various embodiments. The QLC (e.g., the QLC 340 of FIG. 3) is enabled to perform a set of quantum operations on a pair of qubits comprising a first qubit and a second qubit. The QLC may be characterized by a set of intrinsic parameters (e.g., the set of intrinsic parameters 840 of FIG. 8). Method 1000 may incorporate one or more steps of the generalized scheme 400 of FIG. 4. Method 1000 begins at block 1002, where a set of control vectors (e.g., set of control vectors of step 404 of FIG. 4) is selected. Each control vector (e.g., control vector 342 of FIG. 3) of the set of vectors may be associated with a set of phase shifts for at least a subset of the set of intrinsic parameters such that a set of experimental unitary operators for the QLC is defined. Each experimental unitary operator (e.g., the unitary operator 380 of FIG. 3) of the set of experimental unitary operators may be based on the set of intrinsic parameters and a set of phase shifts (e.g., set of phase shifts 344 of FIG. 4) associated with a corresponding control vector of the set of control vectors.

At block 1004, and for each control vector of the set of control vectors, a set of estimated eigenvalues (e.g., the set of eigenvalues 506 of FIG. 5) for the corresponding unitary operator is determined. Determining the set of estimated eigenvalues for the control vector (or the experimental unitary operator) may be based a set of qubit measurements performed subsequent to tuning the QLC in accordance with the control vector (e.g., see FIG. 6). Each estimated eigenvalue of the set of estimated eigenvalues may correspond to a quasienergy level of the pair of qubits.

At block 1006, and for each control vector of the set of control vectors, a set of quasienergy level differences is determined. Determining the set of quasienergy level differences for the control vector may be based on the set of estimated eigenvalues for the control vector. At block 1008, a set of coefficients (e.g., the set of coefficients 802 of FIG. 8) is determined. The set of coefficients may define a characteristic polynomial (e.g., equation 800 of FIG. 8) for the QLC. Determining the set of coefficients may be based on the set of quasienergy level differences for each control vector of the set of control vectors. At block 1010, a cost function (e.g., cost function 810 of FIG. 8) may be generated. Generating the cost function may be based on the set of coefficients and the set of control vectors. At block 1012, values for the set of intrinsic parameters may be determined. Determining the values for the set of intrinsic parameters may be based on an extremum (e.g., a minimum) of the cost function (e.g., see FIG. 9).

In various embodiments, the QLC may include a first multi-qubit gate, a first single-qubit gate, and a second single-qubit gate. The first multi-qubit gate may be a Fermionic Simulation (fSim) gate that operates on both the first qubit and the second qubit. The first single-qubit gate may be a first microwave gate that operates on the first qubit. The second single-qubit gate may be a second microwave gate that operates on the second qubit.

The set of quasienergy level differences for the control vector may be determined based on a Fourier analysis of the set of qubit measurements for the control vector. In some embodiments, and for each control vector of the set of control vectors, a set of estimated eigenstates may be determined based on the experimental unitary operator that corresponds to the control vector. For each control vector of the set of control vectors, the set of qubit measurements may be performed based on the set of estimated eigenstates. Performing the set of qubit measurements for the control vector may include preparing an initial state of the qubit pair. The initial state may include a superposition of a pair of eigenstates of the set of estimated eigenstates for the control vector. To tune the QLC in accordance with the control vector, microwave signals may be provided to the QLC. Subsequent to preparing the initial state of the qubit pair and providing the microwave signals to the QLC, the qubit pair may be repeatably subjected to the set of quantum operations of the QLC. In some embodiments, preparing the initial state of the qubit pair may include preparing the initial state for at least three pairs of eigenstates of the set of estimated eigenstates.

In various embodiments, the QLC may operate on a set of qubit pairs that includes the qubit pair and the set of qubit measurements is performed on the set of qubit pairs. The set of control vectors may include at least three control vectors and each control vector of the set of control vectors is a 3D vector. Each phase shift of the set of phase shifts may correspond to a $R_Z$ operation of the QLC. The characteristic polynomial may be a fourth order polynomial. The set of intrinsic parameters includes at least seven rotational angles (or phase shifts).

Implementations of the digital, classical, and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital or classical computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more tangible, non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for characterizing a quantum logic circuit (QLC) that is enabled to perform a set of quantum operations on a pair of qubits that includes a first qubit and a second qubit, and the QLC is characterized by a set of intrinsic parameters, the method comprising:
    selecting a set of control vectors, wherein each control vector of the set of vectors is associated with a set of phase shifts for at least a subset of the set of intrinsic parameters such that a set of experimental unitary operators for the QLC is defined and each experimental unitary operator of the set of experimental unitary operators is based on the set of intrinsic parameters and a set of phase shifts associated with a corresponding control vector of the set of control vectors;
    for each control vector of the set of control vectors, determining a set of estimated eigenvalues for the corresponding unitary operator based on a set of qubit measurements performed subsequent to tuning the QLC in accordance with the control vector, wherein each estimated eigenvalue of the set of estimated eigenvalues corresponds to a quasienergy level of the pair of qubits;
    determining values for the set of intrinsic parameters based at least in part on a set of quasienergy level differences for the control vector.

2. The method of claim 1, further comprising:
    for each control vector of the set of control vectors, determining a set of quasienergy level differences based on the set of estimated eigenvalues for the control vector;
    determining a set of coefficients that define a characteristic polynomial for the QLC based on the set of quasienergy level differences for each control vector of the set of control vectors;
    generating a cost function based on the set of coefficients and the set of control vectors; and
    determining the values for the set of intrinsic parameters based on an extremum of the cost function.

3. The method of claim 1, wherein the QLC includes a first multi-qubit gate, a first single-qubit gate, and a second single-qubit gate.

4. The method of claim 3, wherein the first multi-qubit gate is a Fermionic Simulation (fSim) gate that operates on both the first qubit and the second qubit, the first single-qubit gate is a first microwave gate that operates on the first qubit, and the second single-qubit gate is a second microwave gate that operates on the second qubit.

5. The method of claim 3, wherein the set of quasienergy level differences for the control vector is determined based on a Fourier analysis of the set of qubit measurements for the control vector.

6. The method of claim 1, further comprising:
    for each control vector of the set of control vectors, determining a set of estimated eigenstates based on the experimental unitary operator that corresponds to the control vector; and
    for each control vector of the set of control vectors, performing the set of qubit measurements based on the set of estimated eigenstates.

7. The method of claim 6, wherein performing the set of qubit measurements for the control vector comprises:
    preparing an initial state of the pair of qubits that includes a superposition of a pair of eigenstates of the set of estimated eigenstates for the control vector;
    providing microwave signals to the QLC to tune the QLC in accordance with the control vector; and subsequent to preparing the initial state of the pair of qubits and providing the microwave signals to the QLC, repeatably subjecting the pair of qubits to the set of quantum operations of the QLC.

8. The method of claim 7, wherein preparing the initial state of the pair of qubits includes preparing the initial state for at least three pairs of eigenstates of the set of estimated eigenstates.

9. The method of claim 1, wherein the QLC operates on a set of pairs of qubits that includes the pair of qubits and the set of qubit measurements is performed on the set of pairs of qubits.

10. The method of claim 1, where the set of control vectors includes at least three control vectors and each control vector of the set of control vectors is a 3D vector.

11. The method of claim 1, wherein each phase shift of the set of phase shifts corresponds to a $R_Z$ operation of the QLC.

12. The method of claim 2, wherein the characteristic polynomial is a fourth order polynomial.

13. The method of claim 1, wherein the set of intrinsic parameters includes at least seven rotational angles.

14. A quantum computing system, comprising:
a pair of qubits that includes a first qubit and a second qubit;
a quantum logic circuit (QLC) that is enabled to perform a set of operations on the pair of qubits and is characterized by a set of intrinsic parameters;
one or more processors;
one or more memory devices, the one or more memory devices storing computer-readable instructions that when executed by the one or more processors cause the one or more processors to perform operations for characterizing the QLC, the operations comprising:
selecting a set of control vectors, wherein each control vector of the set of vectors is associated with a set of phase shifts for at least a subset of the set of intrinsic parameters such that a set of experimental unitary operators for the QLC is defined and each experimental unitary operator of the set of experimental unitary operators is based on the set of intrinsic parameters and a set of phase shifts associated with a corresponding control vector of the set of control vectors;
for each control vector of the set of control vectors, determining a set of estimated eigenvalues for the corresponding unitary operator based a set of qubit measurements performed subsequent to tuning the QLC in accordance with the control vector, wherein each estimated eigenvalue of the set of estimated eigenvalues corresponds to a quasienergy level of the pair of qubits;
for each control vector of the set of control vectors, determining a set of quasienergy level differences based on the set of estimated eigenvalues for the control vector;
determining a set coefficients that define a characteristic polynomial for the QLC based on the set of quasienergy level differences for each control vector of the set of control vectors;
generating a cost function based on the set of coefficients and the set of control vectors; and
determining values for the set of intrinsic parameters based on an extremum of the cost function.

15. The system of claim 14, wherein the QLC includes a first multi-qubit gate and a second multi-qubit gate.

16. The system of claim 15, wherein the first multi-qubit gate is a first Fermionic Simulation (fSim) gate that operates on both the first qubit and the second qubit and the second multi-qubit gate is a second fSim gate that operates on both the first qubit and the second qubit.

17. The system of claim 14, wherein the set of quasienergy level differences for the control vector is determined based on a Fourier analysis of the set of qubit measurements for the control vector.

18. The system of claim 14, the operations further comprise:
for each control vector of the set of control vectors, determining a set of estimated eigenstates based on the experimental unitary operator that corresponds to the control vector; and
for each control vector of the set of control vectors, performing the set of qubit measurements based on the set of estimated eigenstates.

19. The system of claim 18, wherein performing the set of qubit measurement for the control vector comprises:
preparing an initial state of the pair of qubits that includes a superposition of a pair of eigenstates of the set of estimated eigenstates for the control vector;
providing microwave signals to the QLC to tune the QLC in accordance with the control vector; and
subsequent to preparing the initial state of the pair of qubits and providing the microwave signals to the QLC, repeatably subjecting the pair of qubits to the QLC.

20. A quantum logic circuit (QLC) that is enabled to perform a set of quantum operations on a pair of qubits comprising a first qubit and a second qubit and the QLC is characterized by a set of intrinsic parameters, and the QLC has been characterized:
selecting a set of control vectors, wherein each control vector of the set of vectors is associated with a set of phase shifts for at least a subset of the set of intrinsic parameters such that a set of experimental unitary operators for the QLC is defined and each experimental unitary operator of the set of experimental unitary operators is based on the set of intrinsic parameters and a set of phase shifts associated with a corresponding control vector of the set of control vectors;
for each control vector of the set of control vectors, determining a set of estimated eigenvalues for the corresponding unitary operator based a set of qubit measurements performed subsequent to tuning the QLC in accordance with the control vector, wherein each estimated eigenvalue of the set of estimated eigenvalues corresponds to a quasienergy level of the pair of qubits;
for each control vector of the set of control vectors, determining a set of quasienergy level differences based on the set of estimated eigenvalues for the control vector;
determining a set coefficients that define a characteristic polynomial for the QLC based on the set of quasienergy level differences for each control vector of the set of control vectors;
generating a cost function based on the set of coefficients and the set of control vectors; and
determining values for the set of intrinsic parameters based on an extremum of the cost function.

* * * * *